(12) United States Patent
Matsuwaka et al.

(10) Patent No.: US 9,741,648 B2
(45) Date of Patent: Aug. 22, 2017

(54) WIRING BOARD

(71) Applicant: KYOCERA Circuit Solutions, Inc., Kyoto (JP)

(72) Inventors: Hiroki Matsuwaka, Satsumasendai (JP); Hisayoshi Wada, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/078,061

(22) Filed: Mar. 23, 2016

(65) Prior Publication Data

US 2016/0284636 A1 Sep. 29, 2016

(30) Foreign Application Priority Data

Mar. 24, 2015 (JP) ................. 2015-060296

(51) Int. Cl.
*H01L 23/498* (2006.01)
(52) U.S. Cl.
CPC .. *H01L 23/49822* (2013.01); *H01L 23/49827* (2013.01); *H01L 23/49838* (2013.01); *H01L 2224/81* (2013.01)
(58) Field of Classification Search
CPC .............. H01L 23/49838; H01L 23/50; H01L 2924/15312; H01L 2224/16225; H01L 2224/05573; H01L 2224/05568; H01L 2924/00014; H01L 2924/00; H05K 1/111; H05K 1/0224; H05K 2201/09227; H05K 2201/093; H05K 2201/09418; H05K 2201/09681; Y02P 70/611
See application file for complete search history.

(56) References Cited

U.S. PATENT DOCUMENTS

| | | | | |
|---|---|---|---|---|
| 5,519,176 A | * | 5/1996 | Goodman | ......... H01L 23/49822 174/250 |
| 5,763,947 A | * | 6/1998 | Bartley | ............. H01L 23/49816 257/691 |
| 6,106,923 A | * | 8/2000 | Takahashi | ........... H01L 23/5383 174/254 |
| 6,420,017 B1 | * | 7/2002 | Matsuda | ........... H01L 23/49827 174/261 |

(Continued)

FOREIGN PATENT DOCUMENTS

| | | | |
|---|---|---|---|
| JP | 2011-249734 | * | 12/2011 |
| JP | 2011-249734 A | | 12/2011 |

(Continued)

OTHER PUBLICATIONS

Sigrity Simulations for Power Integrity Jan. 16, 2010.*

(Continued)

*Primary Examiner* — Michael F McAllister
(74) *Attorney, Agent, or Firm* — Volpe and Koenig, P.C.

(57) ABSTRACT

A wiring board includes an insulating substrate having a plurality of laminated insulating layers and a mounting part in one surface of the insulating substrate, a large number of semiconductor element connection pads, a large number of external connection pads, and a solid pattern extending from a region corresponding to the mounting part to the peripheral portion of the insulating substrate, and including a straight line shaped current path without intervention of gas vent openings.

1 Claim, 4 Drawing Sheets

(56) References Cited

U.S. PATENT DOCUMENTS

| | | | |
|---|---|---|---|
| 6,793,500 B1 * | 9/2004 | Budell | H01L 23/49838 174/51 |
| 6,831,233 B2 * | 12/2004 | Wood | H01L 23/49822 174/250 |
| 6,977,345 B2 * | 12/2005 | Budell | H05K 1/0224 174/250 |
| 7,152,313 B2 * | 12/2006 | Wood | H01L 23/49822 156/514 |
| 2005/0006752 A1 | 1/2005 | Ogawa | |
| 2005/0250310 A1 | 11/2005 | Ogawa | |
| 2006/0044735 A1 | 3/2006 | Hayashi et al. | |
| 2006/0125083 A1 | 6/2006 | Ogawa | |
| 2007/0145568 A1 | 6/2007 | Ogawa | |

FOREIGN PATENT DOCUMENTS

| | | |
|---|---|---|
| TW | 200409337 A | 6/2004 |
| TW | 200620577 A | 6/2006 |

OTHER PUBLICATIONS

How a Team-Based Approach to PCB Power Integrity Analysis Yields Better Results by Brad Brim, Sr. Staff Product Engineer, Cadence Design Systems © 2014 Cadence Design Systems, Inc. All rights reserved.*

Cadence Sigrity PowerDC DC and thermal analysis for packages and boards © 2013 Cadence Design Systems, Inc. All rights reserved.*

Taiwan Office Action with English concise explanation, Taiwan Patent Application No. 105108656, dated Apr. 6, 2017, 6 pgs.

* cited by examiner

WIRING BOARD

BACKGROUND OF THE INVENTION

1. Field of the Invention

The present invention relates to a wiring board for mounting a semiconductor element thereon.

2. Description of the Related Art

A conventional wiring board 40 used for mounting thereon a semiconductor element S', such as a semiconductor integrated circuit element, is shown in FIG. 4. The wiring board 40 includes an insulting substrate 21 having a plurality of build-up insulating layers 21b respectively laminated on upper and lower surfaces of a core insulating layer 21a, wiring conductors 22 respectively disposed inside the insulating substrates 21 and on upper and lower surfaces thereof, and a solder resist layer 23 adhered onto the outermost insulating layer 21b and the wiring conductors 22.

A mounting part 40A disposed in a middle portion of an upper surface of the wiring board 40 is a square-shaped region for mounting the semiconductor element S' thereon. A large number of semiconductor element connection pads 24 are arranged in a two-dimensional layout on the mounting part 40A. The semiconductor element connection pads 24 are formed by exposing a part of the wiring conductor 22 adhered to the upper surface of the insulating substrate 21 from openings disposed in the overlying solder resist layer 23. An electrode T' of the semiconductor element S' is connected to the semiconductor element connection pads 24 by flip-chip connection.

A lower surface of the wiring board 40 serves as a connection surface with respect to an external electrical circuit board, and a large number of external connection pads 25 are arranged in a two-dimensional layout over an approximately entire region of the connection surface. The external connection pads 25 are formed by exposing a part of the wiring conductor 22 adhered to the lower surface of the insulating substrate 21 from openings disposed in the underlying solder resist layer 23. The external connection pads 25 are connected to a wiring conductor of the external electrical circuit board with, for example, a solder ball interposed therebetween.

A large number of through holes 26 are disposed in the insulating layer 21a. A through conductor 27 is adhered into the through holes 26. The wiring conductors 22 on the upper and lower surfaces of the insulating layer 21a are connected to each other via the through conductor 27.

A large number of via holes 28 are disposed in each of the insulating layers 21b. A through conductor 29 is adhered into the via holes 28. The overlying and underlying wiring conductors 22 are connected to each other via the through conductor 29 and with the insulating layer 21b interposed therebetween.

The wiring conductors 22 including the semiconductor element connection pads 24 and the external connection pads 25 are individually used for signal, grounding, and power supply. Most of the semiconductor element connection pads 24 for signal are disposed along a peripheral portion of the mounting part 40A. Most of the semiconductor element connection pads 24 for grounding and the semiconductor element connection pads 24 for power supply are disposed in a middle portion of the mounting part 40A. Most of the external connection pads 25 for signal are disposed along a peripheral portion of the lower surface of the insulating substrate 21. The external connection pads 25 for grounding and the external connection pads 25 for power supply are disposed in a middle portion and a peripheral portion of the lower surface of the insulating substrate 21.

The semiconductor element connection pads 24 respectively for signal, grounding, and power supply, and the external connection pads 25 respectively for signal, grounding, and power supply are connected to one another via the wiring conductors 22 respectively for signal, grounding, and power supply. The wiring conductor 22 for signal has a band-shaped pattern 30 extending from a region of the surface of the insulating layer 21b laminated on the upper surface of the insulating layer 21a which corresponds to the mounting part 40A, toward a peripheral portion of the insulating plate 21. The band-shaped pattern 30 and the semiconductor element connection pads 24 for signal are connected to each other directly or via the through conductor 29 in the region corresponding to the mounting part 40A. The band-shaped pattern 30 and the external connection pads 25 for signal are connected to each other via the through conductors 27 and 29 in the peripheral portion of the insulating substrate 21.

The wiring conductor 22 for grounding and the wiring conductor 22 for power supply have a solid pattern 31 having a large area disposed oppositely to the wiring conductor 22 for signal. The solid pattern 31 is disposed on the surface of the internal insulating layer 21b that is laminated on the upper surface of the insulating layer 21a. The solid pattern 31 extends from the region corresponding to the mounting part 40A to the peripheral portion of the insulating substrate 21 over a wide range. The solid pattern 31 and the semiconductor element connection pads 24 for grounding or power supply are connected to each other via the through conductor 29 in a region immediately below the mounting part 40A. The solid pattern 31 and the external connection pads 25 for grounding or power supply are connected to each other via the through conductors 27 and 29 in a region of the insulating substrate 21 which extends from a middle portion thereof to a peripheral portion thereof.

FIG. 5 is a plan view showing a main part of the solid pattern 31 for grounding or power supply. In FIG. 5, positions of the external connection pads 25 for grounding or power supply are indicated by a dotted line. An upper left region indicated by an alternate long and two short dashes line is the region corresponding to the mounting part 40A.

The solid pattern 31 has a large number of land openings 32 in the region corresponding to the mounting part 40A. Via lands 33 are respectively disposed in the land openings 32. The solid pattern 31 and the via lands 33 are spaced a predetermined distance. The through conductor 29 of the overlying insulating layer 21b is connected onto the via lands 33. The via lands 33 are respectively connected to the semiconductor element connection pads 24 via the through conductor 29 connected onto the via lands 33. The semiconductor element connection pads 24 to be respectively connected to the via lands 33 are the semiconductor element connection pads 24 for grounding, power supply, or signal which have a different potential from that of the solid pattern 31.

The solid pattern 31 has via connection parts 34 with respect to the overlying conductor layer 22 at positions indicated by a circle of broken line in the region corresponding to the mounting part 40A. The through conductor 29 of the overlying insulating layer 21b is connected onto the via connection parts 34. The solid pattern 31 is connected to the semiconductor element connection pads 24 for grounding or power supply which have the same potential as the solid pattern 31, via the through conductor 29 connected onto the via connection parts 34.

The solid pattern 31 has via connection parts 35 with respect to the underlying conductor layer 22 at positions indicated by a circle of broken line in a region corresponding to a peripheral portion of the wiring board 40. The through conductor 29 of the underlying insulating layer 21b is connected beneath the via connection parts 35. The solid pattern 31 is connected to the external connection pads 25 for grounding or power supply which have the same potential as the solid pattern 31, via the through conductor 29 connected to the via connection parts 35.

The solid pattern 31 includes a large number of gas vent holes 36. The gas vent openings 36 are dispersedly disposed over the entirety of a region not provided with the land opening 32. The gas vent openings 36 are disposed to discharge outgas generated from the insulating layers 21a and 21b to the outside. In the absence of the gas vent openings 36, it is highly possible that swelling and peeling occur between the insulating layer 21a or 21b and the wiring conductor 22 lying thereabove due to the outgas. The occurrence of swelling and peeling may impair a normal function of the wiring board 40. Therefore, the gas vent openings 36 are indispensable for the wiring board 40.

Recently, an operating voltage in the semiconductor element S' as shown in FIG. 4 has been decreased and a current needed for operation has been increased. In the wiring board 40 having the semiconductor element S' mounted thereon, a voltage drop (IR Drop) between the semiconductor element connection pads 24 and the external connection pads 25 in the wiring conductor 22 for grounding and the wiring conductor 22 for power supply is preferably as small as possible.

For example, in a wiring board proposed in Japanese Unexamined Patent Publication No. 2011-249734, openings that permit direct adhesion between a solder resist layer and an insulating substrate are disposed around semiconductor element connection pads in a region extending from a solid pattern around a mounting part to the mounting part. The openings thus formed make it possible to decrease a proportion of an area occupied by a wiring conductor layer in the region. This contributes to reducing thermal stress that occurs between the wiring conductor layer and the solder resist layer due to a difference in coefficient of thermal expansion therebetween, thereby increasing an area that permits direct adhesion between the insulating substrate and the solder resist layer. It is therefore concluded that the insulating substrate and the solder resist layer can be strongly adhered to each other.

However, the openings of the wiring board proposed in Japanese Unexamined Patent Publication No. 2011-249734 and the large number of gas vent openings 36 disposed in the solid pattern 31 shown in FIG. 5 act to increase an electrical resistance value of the solid pattern 31. This results in a large voltage drop between the semiconductor element connection pads 24 and the external connection pads 25 in the wiring conductor 22 for grounding and the wiring conductor 22 for power supply. When the semiconductor element S' having a low operating voltage and a large operating current is mounted on the conventional wiring board 40, it may be difficult to ensure sufficient power supply to the semiconductor element S', thus failing to ensure normal operation of the semiconductor element S'.

SUMMARY OF THE INVENTION

An embodiment of the present invention aims at providing a wiring board that ensures sufficient power supply to a semiconductor element to be mounted thereon, thereby ensuring normal operation of the semiconductor element.

The wiring board according to the embodiment of the present invention includes an insulating substrate, a large number of semiconductor element connection pads, a large number of external connection pads, and a solid pattern. The insulating substrate includes a plurality of laminated insulating layers including an internal insulating layer and an external insulating layer. The insulating substrate includes a mounting part disposed in a middle portion of one surface of the insulating substrate. The semiconductor element connection pads including ones for grounding, power supply and signal are arranged in a two-dimensional layout within the mounting part of the insulating substrate. The external connection pads including ones for grounding, power supply and signal are arranged in a two-dimensional layout in a region from a middle portion of another surface of the insulating substrate to a peripheral portion of the insulating substrate. The solid pattern for grounding or power supply extends from a region corresponding to the mounting part to the peripheral portion of the insulating substrate on the internal insulating layer of the insulating substrate. The solid pattern for grounding or power supply is connected immediately below the mounting part to the semiconductor element connection pads for grounding or power supply via a first through conductor penetrating the insulating layer. The solid pattern for grounding or power supply is connected to the external connection pads for grounding or power supply via a second through conductor penetrating the insulating layer on a peripheral side beyond the mounting part. The solid pattern includes a large number of gas vent openings and a straight line shaped current path without intervention of the gas vent openings between the first through conductor and the second through conductor.

DESCRIPTION OF THE EMBODIMENTS

Figure 1:
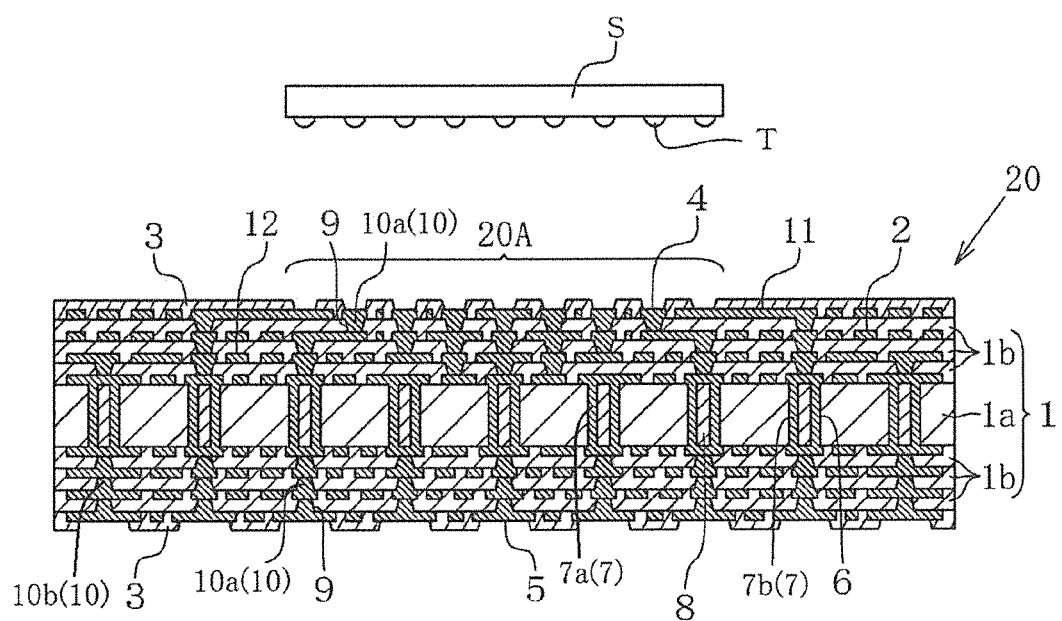
FIG. 1 is a schematic sectional view showing an example of a wiring board according to an embodiment of the present invention.

A wiring board according to an embodiment of the present embodiment is described in detail below with reference to FIGS. 1 and 2. FIG. 1 is a schematic sectional view showing the wiring board 20 that is an example of the embodiment of the present invention. As shown in FIG. 1, the wiring board 20 includes an insulating substrate 1, wiring conductors 2, solder resist layers 3, semiconductor element connection pads 4, and external connection pads 5.

More specifically, the wiring board 20 includes the insulating substrate 1 having a plurality of build-up insulating layers 1b respectively laminated on upper and lower surfaces of a core insulating layer 1a, the wiring conductors 2 respectively adhered to the upper and lower surfaces of the insulating layer 1a and onto each of the insulating layers 1b, and the solder resist layers 3 respectively adhered onto the outermost insulating layer 1b and the wiring conductors 2.

Amounting part 20A is disposed in a middle portion on one surface (hereinafter called as upper surface) of the wiring board 20. The mounting part 20A is a square-shaped region for mounting a semiconductor element S thereon. A large number of the semiconductor element connection pads 4 are arranged in a two-dimensional layout on the mounting part 20A. The semiconductor element connection pads 4 are formed by exposing a part of the wiring conductor 20 adhered to upper surface of the insulating substrate 1 from openings disposed in the solder resist layer 3. An electrode T of the semiconductor element S is connected to the semiconductor element connection pads 4 by flip-chip connection. The semiconductor element connection pads 4 have a diameter of approximately 50 to 100 μm. The semiconductor element connection pads 4 have an array pitch of approximately 100 to 250 μm. The number of the semiconductor element connection pads 4 is not limited, but it is normally preferable to have approximately 5000 to 20000 semiconductor element connection pads in the region of the mounting part 20A.

Another surface (hereinafter called as lower surface) of the wiring board 20 serves as a connection surface with respect to an external electrical circuit board. A large number of the external connection pads 5 are arranged in a two-dimensional layout over an approximately entire region of the lower surface of the wiring board 20. The external connection pads 5 are formed by exposing a part of the wiring conductors 2 adhered to lower surface of the insulating substrate 1 from openings disposed in the solder resist layer 3 close to the lower surface. The external connection pads 5 are connected to a wiring conductor of the external electrical circuit board with, for example, a solder ball interposed therebetween. The external connection pads 5 have a diameter of approximately 300 to 500 μm. The external connection pads 5 have an array pitch of approximately 600 to 1000 μm. The number of the external connection pads 5 is not limited, but it is normally preferable to have approximately 1000 to 3000 external connection pads 5.

The insulating layer 1a constituting the insulating substrate 1 is a core member of the wiring board 20. The insulating layer 1a is obtainable by, for example, impregnating a glass fabric having glass fiber bundles interweaved vertically and laterally with a thermosetting resin, such as epoxy resin and bismaleimide-triazine resin. The insulating layer 1a has a thickness of approximately 0.1 to 1 mm. The insulating layer 1a has a large number of through holes 6 extending between the upper and lower surfaces thereof. The through holes 6 have a diameter of approximately 0.1 to 1 mm. A through conductor 7 is adhered into the through holes 6. The wiring conductors 2 respectively lying on the upper and lower surfaces of the insulating layer 1a are connected to each other via the through conductor 7.

The insulating layer 1a is producible by thermally curing an insulating sheet in which a glass fabric is impregnated with an uncured thermosetting resin, followed by drilling from upper surface to lower surface of the insulating sheet. The wiring conductors 2 lying on the upper and lower surfaces of the insulating layer 1a are made into a predetermined pattern by sticking copper foil to the entire upper and lower surfaces of the insulating sheet for the insulating layer 1a, and then curing the sheet, followed by etching of the copper foil. The through conductor 7 in the through holes 6 is formable by forming the through holes 6 in the insulating layer 1a, and then depositing a copper plating film on an inner surface of each of the through holes 6 by non-electrolytic plating method or electrolytic plating method.

The through holes 6 into which the through conductor 7 adhered are filled with a hole-filling resin 8. The hole-filling resin 8 is composed of a thermosetting resin, such as epoxy resin and bismaleimide-triazine resin. The hole-filling resin 8 closes the through holes 6, thereby making it possible to form the wiring conductor 2 and the insulating layers 1b immediately above and immediately below the through holes 6. The hole-filling resin 8 is formable by loading an uncured pasty thermosetting resin into the through holes 6 by screen printing method, and then thermally curing this, followed by polishing upper and lower surfaces thereof so as to be approximately flat.

The insulating layers 1b respectively laminated on the upper and lower surfaces of the insulating layer 1a are composed of a thermosetting resin, such as epoxy resin and bismaleimide-triazine resin. Each of the insulating layers 1b has a thickness of approximately 20 to 60 μm. Each of the insulating layers 1b has a plurality of via holes 9 extending between the upper and lower surfaces thereof. The via holes 9 have a diameter of approximately 30 to 100 μm. The via holes 9 are filled with a through conductor 10. The overlying wiring conductor 2 and the underlying wiring conductor 2 are connected to each other via the through conductor 10.

These insulating layers 1b are formable by sticking an insulating film composed of an uncured thermosetting resin having a thickness of approximately 20 to 60 μm to the upper and lower surfaces of the insulating layer 1a or onto the underlying insulating layer 1b, and then thermally curing this, followed by drilling the via holes 9 by laser processing. The wiring conductor 2 on the surface of each of the insulating layers 1b and the through conductor 10 in the via holes 9 are respectively formable by adhering a copper plating to the surface of each of the insulating layers 1a and into the via holes 9 every time the insulating layer 1b is formed. Well-known semi-additive method is used for the adhesion of the copper plating.

The solder resist layer 3 is composed of a thermosetting resin having photosensitivity, such as an acrylic modified epoxy resin. The solder resist layer 3 has a thickness of approximately 10 to 50 μm. The solder resist layer 3 protects the outermost wiring conductor 2, and also permits connection between the semiconductor element connection pads 4 and the semiconductor element S, and connection between the external connection pads 5 and the external electrical circuit board, with the openings interposed therebetween.

The solder resist layer 3 is formable by applying or sticking a resin paste or resin film having photosensitivity to the surface of each of the uppermost and lowermost insulating layers 1b, and then exposing and developing this into a predetermined pattern by employing a photolithographic technology, followed by UV curing and thermal curing.

The wiring conductors 2 including the semiconductor element connection pads 4 and the external connection pads 5 are used for signal, grounding, and power supply. Most of the semiconductor element connection pads 4 for signal are disposed along a peripheral portion of the mounting part 20A. Most of the semiconductor element connection pads 4 for grounding and the semiconductor element connection pads 4 for power supply are disposed in a middle portion of the mounting part 20A. Accordingly, most of the external connection pads 5 for signal are disposed along a peripheral portion of one surface of the insulating substrate 1. The external connection pads 5 for grounding and the external connection pads 5 for power supply are disposed in middle and peripheral portions of another surface of the insulating substrate 1.

The semiconductor element connection pads 4 for signal and the external connection pads 5 for signal are connected to one another via the wiring conductor 2 for signal. The wiring conductor 2 for signal has a band-shaped pattern 11 extending from a region of the surface of the insulating layer 1b laminated on the upper surface of the insulating layer 1a which corresponds to the mounting part 20A, toward a peripheral portion of the insulating substrate 1. The band-shaped pattern 11 and the semiconductor element connection pads 4 for signal are connected to each other directly or via the first through conductor 10a in the region corresponding to the mounting part 20A. The band-shaped pattern 11 and the external connection pads 5 for signal are connected to each other via the second through conductors 7b and 10b in the peripheral portion of the insulating substrate 1.

The semiconductor element connection pads 4 for grounding and the external connection pads 5 for grounding are connected to one another via the wiring conductor 2 for grounding. The semiconductor element connection pads 4 for power supply and the external connection pads 5 for power supply are connected to one another via the wiring conductor 2 for power supply. The wiring conductor 2 for grounding and the wiring conductor 2 for power supply have a solid pattern 12 having a large area disposed oppositely to the wiring conductor 2 for signal. The solid pattern 12 is disposed on the surface of the internal insulating layer 1b laminated on the upper surface of the insulating layer 1a. The solid pattern 12 extends from the region corresponding to the mounting part 20A to the peripheral portion of the insulating substrate 1 over a wide range. The solid pattern 12 and the semiconductor connection pads 4 for grounding or power supply are connected via the first through conductor 10a to each other immediately below the mounting part 20A. The solid pattern 12 and the external connection pads 5 for grounding or power supply are connected to each other via the through conductor 7 and 10 in a region of the insulating substrate 1 which extends from the middle portion thereof to the peripheral portion thereof.

Figure 2:
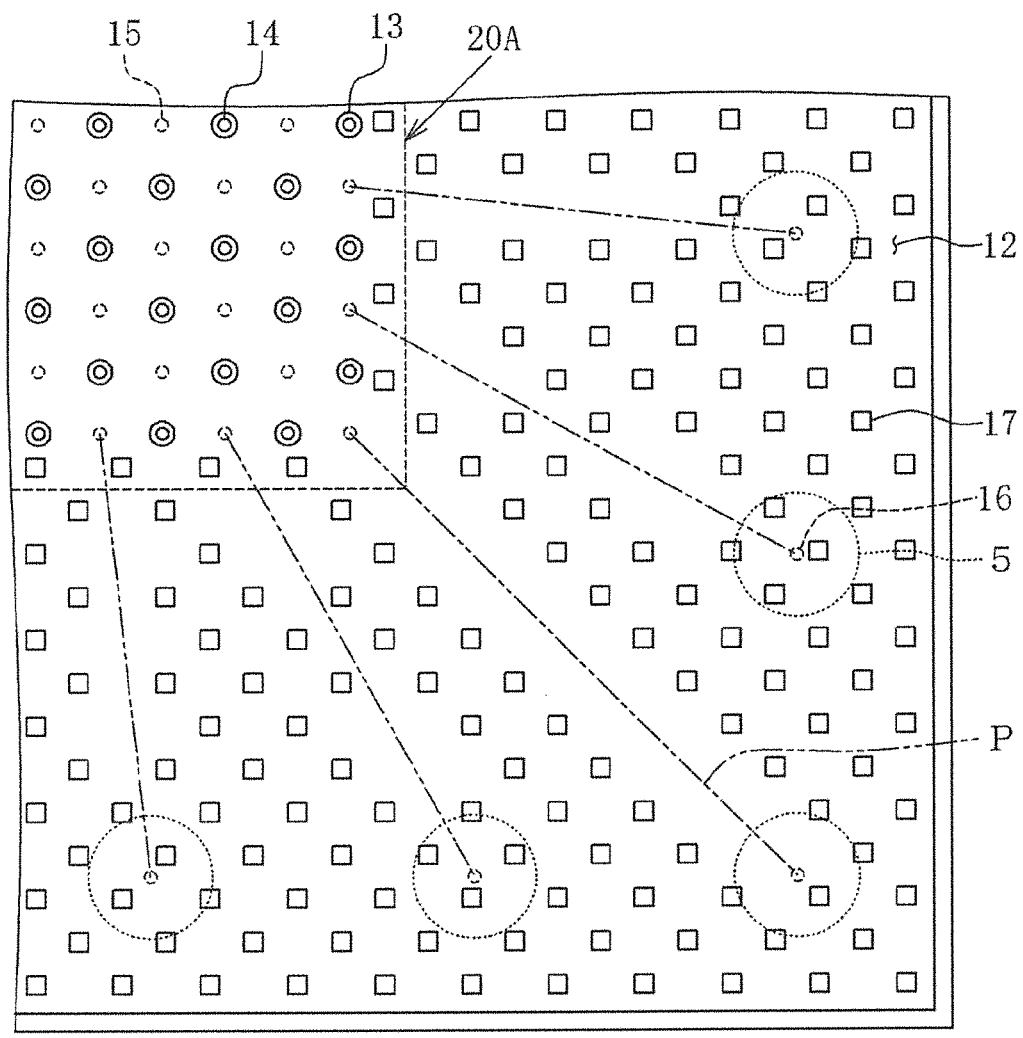
FIG. 2 is a schematic top view showing a main part of a solid pattern in the wiring board shown in FIG. 1.

FIG. 2 is a plan view showing a main part of the solid pattern 12 for grounding or power supply. In FIG. 2, positions of the external connection pads 5 for grounding or power supply are indicated by a dotted line. An upper left region indicated by an alternate long and two short dashes line in FIG. 2 is the region corresponding to the mounting part 20A.

Figure 3:
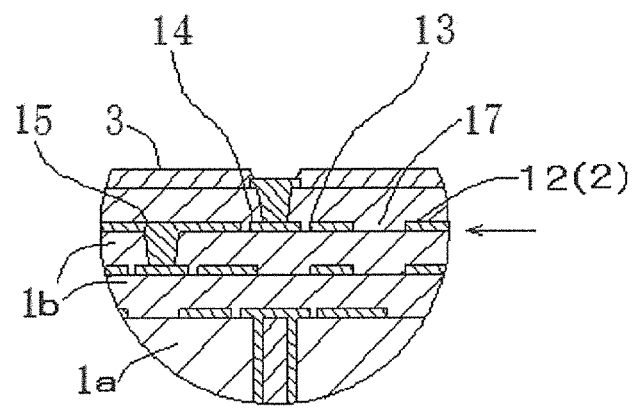
FIG. 3 is a partial cross sectional view of a mounting part in the solid pattern shown in FIG. 2.
Figure 4:
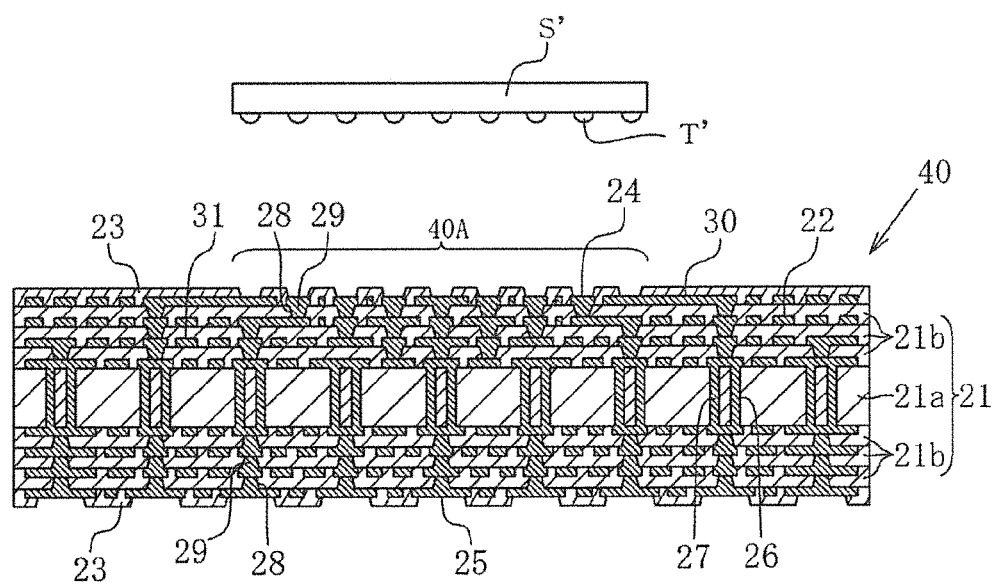
FIG. 4 is a schematic sectional view showing a conventional wiring board.
Figure 5:
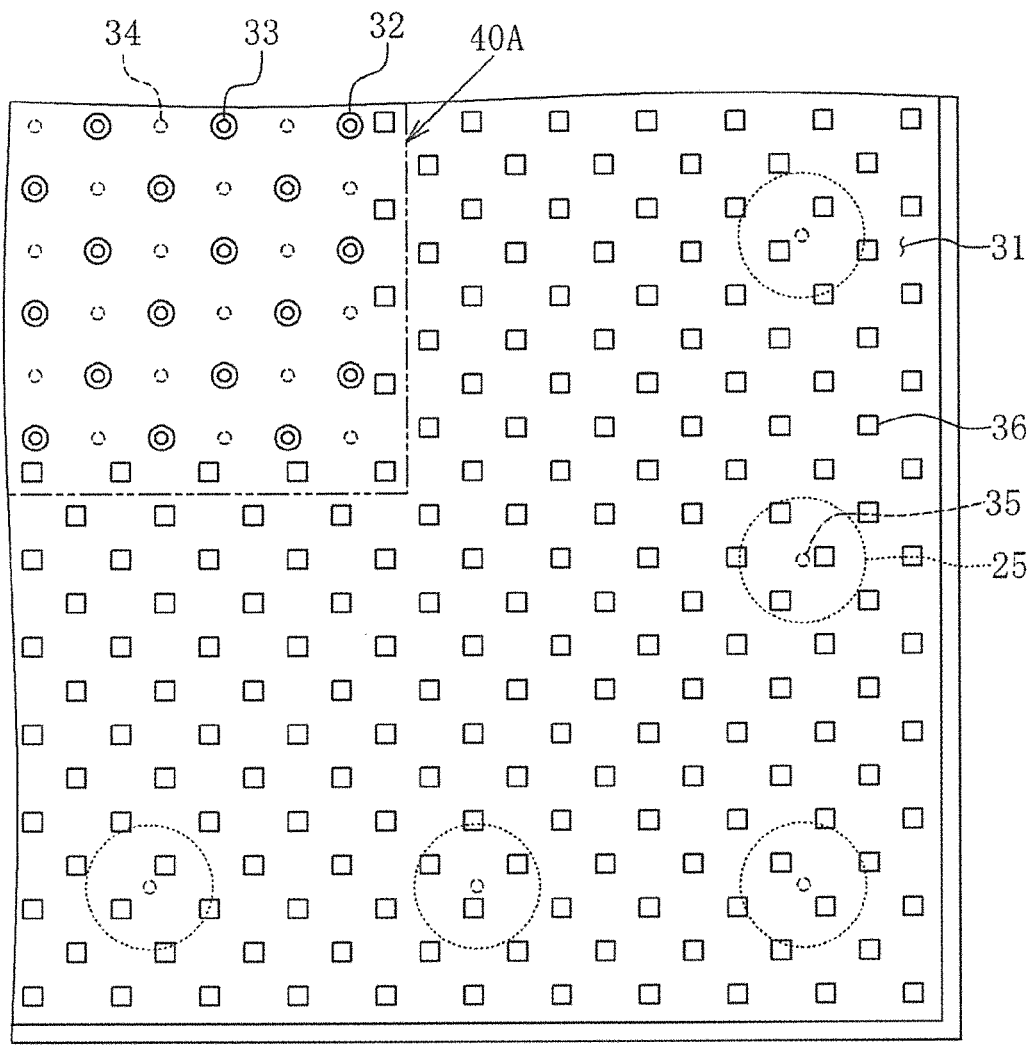
FIG. 5 is a schematic top view showing a main part of a solid pattern in the conventional wiring board.

FIG. 3 is a partial cross sectional view of the mounting part 20A of FIG. 2. In FIG. 3, the portion indicated by an arrow is the solid pattern 12 for grounding or power supply shown in FIG. 2, and this solid pattern 12 is indicated as one of the wiring conductors 2 in FIG. 1.

The solid pattern 12 has a large number of land openings 13 in the region corresponding to the mounting part 20A. Via lands 14 are respectively disposed in the land openings 13. The solid pattern 12 and the via lands 14 are spaced a predetermined distance and are electrically insulated from each other. The first through conductor 10a of the overlying insulating layer 1b is connected onto the via lands 14. The via lands 14 are connected to the semiconductor element connection pads 4 via the first through conductor 10a connected onto the via lands 14. The semiconductor element connection pads 4 to be respectively connected to the via lands 14 are the semiconductor element connection pads 4 for grounding or power supply which have a different potential from that of the solid pattern 12, or the semiconductor element connection pads 4 for signal.

The solid pattern 12 has via connection parts 15 indicated by a circle of broken line in the region corresponding to the mounting part 20A in FIG. 2. The first through conductor 10a of the overlying insulating layer 1b is connected onto the via connection parts 15. The solid pattern 12 is connected to the semiconductor element connection pads 4 via the first through conductor 10a lying on the via connection part 15. The semiconductor element connection pads 4 to be connected to the solid pattern 12 are the semiconductor element connection pads 4 for grounding or power supply which have the same potential as the solid pattern 12.

The solid pattern 12 has via connection parts 16 with respect to the underlying conductor layer 2 at positions indicated by a circle of broken line in a region corresponding to a peripheral portion of the wiring board 20. The second through conductor 10b of the underlying insulating layer 1b is connected beneath the via connection parts 16. The solid pattern 12 is connected to the external connection pads 5 via the second through conductor 10b connected to the via connection part 16. The external connection pads 5 to be connected to the solid pattern 12 are the external connection pads 5 for grounding or power supply which have the same potential as the solid pattern 12.

The solid pattern 12 has a large number of gas vent openings 17 from a peripheral portion of the region corresponding to the mounting part 20A to the peripheral portion of the wiring board 20. The gas vent openings 17 have a square shape in the present embodiment. The gas vent openings 17 have a side length of approximately 70 to 150 μm. The gas vent openings 17 have an array pitch of approximately 150 to 600 μm. The number of the gas vent openings 17 is not particularly limited, but it is preferable to be 5 to 10 pieces/mm² per unit area.

The gas vent openings 16 thus disposed contribute to effective prevention of occurrence of swelling and peeling of the solid pattern 12. A large number of land openings 13 are disposed in the middle portion of the region corresponding to the mounting part 20A. Out gas is to be released to the outside through the land openings 13.

The wiring board 20 includes a straight line shaped current path P without intervention of the gas vent opening 17 between the via connection part 15 configured to connect the first through conductor 10a to be connected to the semiconductor element connection pads 4 for grounding or power supply in the solid pattern 12, and the via connection part 16 configured to connect the second through conductor 10b to be connected to the external connection pads 5 for grounding or power supply.

Consequently, a current flow along the current path P is not inhibited by the gas vent openings 17 in the solid pattern 12 lying between the first through conductor 10a to be connected to the semiconductor element connection pads 4 for grounding or power supply and the second through conductor 10b to be connected to the external connection pads 5 for grounding or power supply. It is therefore possible to effectively minimize voltage drop in the solid pattern 12. This makes it possible to provide the wiring board 20 that ensures sufficient power supply to the semiconductor element S to be mounted thereon, thereby ensuring normal operation of the semiconductor element S.

The distance between the current path P and the gas vent opening 17 which is the closest to the current path P is preferable to be more than 100 μm in order to prevent the current flow along the current path P from being inhibited by the gas vent openings 17. On the other hand, the distance between the current path P and the gas vent opening 17 which is the closest to the current path P is preferable to be less than 300 μmin order to prevent the gas vent function of the openings 17 from lowering.

With the wiring board according to the embodiment of the present invention, the straight line shaped current path without intervention of the gas vent opening is disposed between the first through conductor connected to the semiconductor element connection pads for grounding or power supply and the second through conductor connected to the external connection pads for grounding or power supply. Hence, the current flow is not inhibited by the gas vent openings between the first through conductor and the second through conductor in the solid pattern. This makes it possible to ensure sufficient power supply to the semiconductor element to be mounted, thereby ensuring normal operation of the semiconductor element.

The present invention is not limited to the embodiment as described above, and various changes and modifications may be made within the scope of the appended claims.

What is claimed is:

1. A wiring board comprising:
an insulating substrate comprising a plurality of laminated insulating layers comprising an internal insulating layer and an external insulating layer, the insulating substrate comprising a mounting part disposed in a middle portion of one surface of the insulating substrate;
a large number of semiconductor element connection pads arranged in a two-dimensional layout within the mounting part;
a large number of external connection pads including ones for grounding, power supply and signal, and arranged in a two-dimensional layout in a region from a middle portion of another surface of the insulating substrate to a peripheral portion of the insulating substrate; and
a solid pattern for grounding or power supply extending from a region corresponding to the mounting part to the peripheral portion of the insulating substrate on the internal insulating layer of the insulating substrate, the solid pattern for grounding or power supply being connected immediately below the mounting part to the semiconductor element connection pads for grounding or power supply via a first through conductor penetrating the insulating layer, the solid pattern for grounding or power supply being connected to the external connection pads for grounding or power supply via a second through conductor penetrating the insulating layer on a peripheral side beyond the mounting part,
wherein the solid pattern comprises a large number of gas vent openings and a straight line shaped current path without intervention of the gas vent openings between the first through conductor and the second through conductor,
wherein a distance between the current path and the gas vent opening which is closest to the current path is 100 µm to 300 µm.

* * * * *